United States Patent [19]
Neubacher et al.

[11] Patent Number: 5,541,154
[45] Date of Patent: Jul. 30, 1996

[54] PROCESS FOR PREPARING A HIGH-TC SUPERCONDUCTOR AS A PRECURSOR MATERIAL FOR THE OXIDE-POWDER-IN-TUBE METHOD (OPIT)

[75] Inventors: Marc Neubacher, Frankfurt am Main; Joachim Bock, Erftstadt; Christoph Lang, Frankfurt am Main; Eberhard Preisler, Erftstadt; Helga Weis, Frankfurt am Main, all of Germany

[73] Assignee: Hoechst Aktiengesellschaft, Frankfurt am Main, Germany

[21] Appl. No.: 197,185

[22] Filed: Feb. 16, 1994

[30] Foreign Application Priority Data

Feb. 17, 1993 [DE] Germany .......................... 43 04 755.6

[51] Int. Cl.$^6$ .......................... C04B 35/622; C04B 35/64
[52] U.S. Cl. .......................... 505/450; 505/425; 505/501; 505/733; 505/739; 505/782; 252/518; 252/521
[58] Field of Search .................................. 505/100, 425, 505/450, 501, 733, 739, 782; 252/518, 521

[56] References Cited

U.S. PATENT DOCUMENTS

| | | | |
|---|---|---|---|
| 5,047,391 | 9/1991 | Bock et al. | 505/1 |
| 5,145,831 | 9/1992 | Yamada et al. | 505/1 |
| 5,151,407 | 9/1992 | Provenzano et al. | 505/1 |
| 5,215,961 | 6/1993 | Rayne et al. | 505/739 |
| 5,294,601 | 3/1994 | Bock et al. | 505/1 |
| 5,306,700 | 4/1994 | Hojaji | 505/450 |

FOREIGN PATENT DOCUMENTS

| | | | |
|---|---|---|---|
| 0330214 | 8/1989 | European Pat. Off. | |
| 0362492 | 4/1990 | European Pat. Off. | |
| 0524442 | 1/1993 | European Pat. Off. | |
| 0573798 | 12/1993 | European Pat. Off. | |
| 2271921 | 11/1990 | Japan | 505/782 |

OTHER PUBLICATIONS

Meyer III et al "Occupied Electronic States of Single Crystal $Bi_2Ca_{1+x}Si_{2-x}Cu_2O$" Phys. Rev. B, vol. 38, No. 10, Oct. 1988 pp. 7144–7147.

Luo et al "Effect of Pb + Sb substitution on superconducting Bi–Sr–Ca–Cu–O . . . " Appl. Phys. Lett. 55(14) 2 Oct. 1989 pp. 1448–1450.

Maeda et al., "A New High–$T_c$ Oxide Superconductor without a Rare Earth Element", *Japanese Journal of Applied Physics*, vol. 27, No. 2, pp. L209–L210 (Feb. 1988).

Subramanian et al., "A New High–Temperature Superconductor: $Bi_2Sr_{3-x}Ca_xCu_2O_{8+y}$", *Science*, vol. 239, pp. 1015–1017 (Feb. 1988).

Ibara et al., "Preparation and Crystallization Process of the High–$T_c$ Superconducting Phase ($T_c$(end)>100 K) in Bi, Pb–Sr–Ca–Cu–O Glass–Ceramics", *Japanese Journ. of Applied Physics* vol. 28, No. 1, pp. L37–L40 (Jan. 1989).

Ullrich et al., "Sinter Conditions and Superconducting Properties of Bi–Pb–Sr–Ca–Cu–O Superconductors", *Supercond. Sci. Technol.*, vol. 3, pp. 602–605 (1990).

Tarascon et al., "Superconductivity at 27 K in Modulation–Free $Bi_{2-x}Pb_xSr_{2-y}La_yCuO_6$ Phases with x~y+0.2", *Physica C*, vol. 172, pp. 13–22 (1990).

Ward et al., "Characteristics of Bi–Pb–Sr–Ca–Cu–O Powders Produced by Aerosol Decomposition and Their Rapid Conversion to the High–$T_c$ Phase", *Physica C*, vol. 200, pp. 31–42 (1992).

Ibara et al., "Preparation And Crystallization Process Of The High–$T_c$ Superconducting Phase ($T_c$(end)>100 K) In Bi, Pb–Sr–Ca–Cu–O Glass–Ceramics", *Japanese Journal Of Applied Physics*, vol. 28:L 37–L 40, (Jan. 1989).

Primary Examiner—Paul Lieberman
Assistant Examiner—M. Kopec
Attorney, Agent, or Firm—Foley & Lardner

[57] ABSTRACT

Process for preparing a high-$T_c$ superconductor as a precursor material for the oxide-powder-in-tube method (OPIT). The present invention relates to a process for preparing a high-$T_c$ superconductor as a precursor material for the oxide-powder-in-tube method, which involves mixing the oxides of the elements Bi, Sr, Ca and Cu and completely melting them at temperatures of $\geq 1000°$ C., then casting the melt onto a substrate which is kept at room temperature, and disintegrating the cooled melt block and grinding it into a powder.

16 Claims, No Drawings

PROCESS FOR PREPARING A HIGH-TC SUPERCONDUCTOR AS A PRECURSOR MATERIAL FOR THE OXIDE-POWDER-IN-TUBE METHOD (OPIT)

The family of the superconducting ceramics which are formed from the elements bismuth, strontium, calcium and copper, has essentially three known representatives which have been studied adequately. These are $Bi_2Sr_2Ca_2Cu_3O_x$, known as "3-layer compound", having a transition temperature of 110 K. (H. Maeda et al., Japan. J. Appl. Phys. 27 (1988) L209), $Bi_2Sr_2Ca_1Cu_2O_x$ ("2-layer compound") having a transition temperature of 92 K. (cf. M. A. Subramanian et al., Science 239 (1988) 1015), and the compound $Bi_2Sr_2CuO_x$ ("1-layer compound") having a transition temperature of 10 K. (cf. J. M. Tarascon et al., Physica C 172 (1990) 13). In terms of applications above the temperature of liquid nitrogen, at present only the two first-mentioned compounds from this structural family are relevant. Another industrially relevant superconducting compound having a transition temperature above 77 K. is $YBa_2Cu_3O_{7-x}$ ($T_c$=92 K.).

The actual preparation of oxide-ceramic superconductors is carried out by a solid-state reaction at high temperatures. The reactivity of the intermediate, the so-called precursor, employed for this reaction is an important aspect in determining the time required for forming the superconducting phase. Of the factors which decisively influence the reactivity of precursors, the essential ones to be mentioned are the composition, the homogeneity, the grain size and the phase composition of the powder employed.

If precalcined mechanical mixtures of metal oxides or other compounds such as carbonates or nitrates etc. are used as the starting material (solid-state route), the reaction times for the synthesis of approximately phase-pure 3-layer material are distinctly above 100 h (Freyhardt et al., Supercond. Sci. Technol. 3 (1990) 602).

If precursor material is prepared by a wet-chemical route, for example by coprecipitation, freeze-drying or spray pyrolysis, very homogeneous, reactive powders are obtained. In order to synthesize these materials it is necessary, however, to follow, less favorably compared to the solid-state route, a route more elaborate in terms of process engineering, involving a high proportion of nonutilizable by-products (cf., e.g., Ward et al., Physica C 200 (1992) 31).

The object of the invention is to develop a comparatively simple process which results in a very fine, homogeneous powder which has a high reactivity and is therefore particularly suitable to be employed as a precursor material in the OPIT method.

The object is achieved according to the invention by a process for preparing a high-temperature superconductor containing bismuth, strontium, calcium and copper, wherein a mechanical mixture of the metal oxides, which contains the metals in an atomic ratio corresponding to a superconductor, is completely melted in air at temperatures above 1000° C., the melt is then poured out onto a base which is at room temperature, and the cooled melt bodies are then disintegrated and subsequently ground into powders, which are then reacted, by heating to temperatures above 700° C. in the presence of oxygen, to give the finished high-temperature superconductor. A further possibility consists in secondary tempering, prior to grinding, of the coarsely precrushed solidified melt at temperatures between 600° and 900° C. in a defined gas atmosphere.

The melting process according to the invention produces a very homogeneous mixture of the reaction components. The subsequent cooling operation leads to a composition having a defined phase composition within the melt body, and the final grinding process results in very fine and homogeneous powders. At the end of the grinding process a precursor powder having high reactivity is present which can readily be processed further into high-temperature superconductors.

The specified process is particularly suitable for bismuth-containing superconductors of the formula $Bi_2(Sr, Ca)_2CuO_x$, $Bi_4(Sr, Ca)_5CuO_x$, $Bi_2Sr_2CaCu_2O_x$ and $Bi_2Sr_2Ca_2$—$Cu_3O_x$. In all-the compounds, bismuth can be replaced, up to 50 mol %, by lead and/or antimony. Strontium and calcium may be partially replaced by Y. It is also possible to prepare intermediates, in particular for use in OPIT technology, having varying compositions, for example $Bi_{1.8}Pb_{0.4}Sr_2Ca_{2.2}Cu_3O_x$, $Bi_{1.8}Pb_{0.33}Sr_{1.93}Ca_{1.93}Cu_3O_x$, $Bi_{1.7}Pb_{0.4}Sr_{1.9}Ca_{2.0}Cu_{3.1}O_x$ or $Bi_{1.7}Pb_{0.4}Sr_{1.9}Ca_{1.0}Cu_{2.1}O_x$.

In a first step, the alkaline earth metal carbonates are broken down to give the oxides. This involves heating $SrCO_3$ and $CaCO3$ having a purity $\geq 99\%$ in a corundum crucible in air over a period of 24 h to a temperature of 1300° C. Rehomogenization is then achieved by grinding in a mortar, followed by roasting for another 48 h at 1300° C. in air. The completeness of the break-down reaction is checked by a thermogravimetric measurement (DTA/TG—measurement $\Delta$ differential thermal analysis in conjunction with thermogravimetry), the weight loss observed being below 1%, preferably below 0.1%. In a second step, the alkaline earth metal oxides thus obtained are mixed with the remaining metal oxides in a defined ratio. To this end, CuO and $Bi_2O_3$ having a purity $\geq 99.9\%$, PbO or $PbO_2$ and SrO and CaO (purity$\geq 99\%$) are weighed in, in appropriate amounts, and then mixed by grinding in a mortar. The mechanical mixture thus obtained is again homogenized in a tumbler to attain complete blending.

In a preferred process, $SrCO_3$, $CaCO_3$, $Bi_2O_3$, $PbO_2$ or PbO and CuO or $Cu_2O$ are mixed in a stoichiometric ratio and are heated at temperatures between 600° and 900° C., preferably from 700° to 800° C., under a flowing gas stream of a defined atmosphere. The gas used can be pure oxygen, synthetic air, but preferably pure nitrogen. The tempering operation can be interrupted once or a number of times in order to mix the powder again, it being advisable for the total tempering time to be at least 2 h, preferably at least 6 h. A powder is obtained whose C content is less than 5000 ppm, preferably less than 1000 ppm.

Afterwards the oxide mixture is filled into a crucible and then melted in a muffle furnace at temperatures above 1000° C., preferably above 1050° C. In order to achieve complete melting of the mechanical mixture, the melting time is more than 15 min, preferably more than 30 min.

Suitable crucible materials are magnesium oxide, aluminum oxide or zirconium oxide, but preferably a platinum crucible is used. Quantitative atomic emission analysis (ICP-AES analysis) of the solidified melt shows the content of individual impurities which are produced by reaction of the crucible material with the melt. In particular, the following values were measured:

Al>3000 ppm
Mg> 500 ppm
Pt<500 ppm

The crucible with the liquid melt is then taken from the furnace and emptied. In so doing, the crucible is first briefly swung round within the furnace and is then immediately emptied outside the furnace. The time between removal and emptying, in so doing, is kept as short as possible and should preferably not be more than 5 s, so that no premature solidification of parts of the melt, while still within the crucible, takes place. It is also possible, when using a tiltable melting furnace, to pour out the liquid melt without first removing the crucible from the furnace, so that premature solidification is avoided. It is also possible to stir the melt prior to pouring out, using a motor-driven stirrer whose stirring tool is platinum-coated.

According to the invention, the melt is poured out onto a thermally stable plate, preferably composed of heat-resistant glass ceramic (e.g. ®Ceram from Schott, Mainz) or copper, into copper troughs or into quartz tubes of varying length and varying diameter (melt casting). The base onto or into which the melt is cast is at room temperature, and the cooling rate of the melt is in the range between 1 and 100 K/s, preferably between 5 and 30 K/s. X-ray powder diffraction studies of melt bodies thus obtained show, as crystalline fractions, the 1-layer compound, copper oxide and alkaline earth metal cuprates and plumbates, and microscopic studies suggest estimated crystalline-phase fractions of from 20 to 80%.

If the process of cooling the melt is carried out very rapidly, by pouring, e.g., into ice water or quenching between copper plates pressed together, a material having predominantly amorphous fraction is obtained (cf. Ibara et al., Jap. J. Appl. Phys. 28 (1989) L37), whereas a process in which the cooling process is prolonged with the aid of a furnace leads to a material having predominantly crystalline fractions.

The solidified melt bodies are then broken up coarsely, manually in a mortar or with a hammer, or optionally mechanically with a jaw crusher. At this point in the process, the coarsely broken material can be subjected to a tempering treatment. Phase compositions required, in particular, for the OPIT precursor material can be set by single-, but preferably multi-stage tempering at temperatures between 600° and 900° C., preferably between 700° and 850° C. To this end, a defined oxygen partial pressure must be maintained during tempering. Said pressure at the start of tempering is above 5%, preferably above 15%, the temperature being preferably above 800° C. In a second stage, with a temperature preferably below 800° C., the oxygen partial pressure is then below 5%, or more advantageously below 1%, especially $\leq 0.1\%$. The material is then further coarsely crushed, which may be done in an automatic mortar mill or an analytical mill over a period of at least 15 min, preferably from 2 to 4 hours. In a final grinding step, the material is then further reduced in size until the maximum finenesses which can be attained for the various systems, such as planetary mills, air-jet mills, etc., are achieved. The following grain sizes were typically measured with the aid of the laser light-scattering method:

Planetary mills $d_{50}=3$ to 5 µm; $d_{90}=13$ to 15 µm
Air-jet mills $d_{50}=1$ to 4 µm; $d_{90}=2$ to 6 µm During the size reduction and grinding steps, the grinding forces arising cause abrasion on the grinding medium. This leads to contamination of the grinding stock in question. For example, in planetary mills using a grinding medium composed of $ZrO_2$, less than 50 ppm Zr was found in the grinding stock. In air-jet mills it is possible, by coating the steel parts with tungsten carbide, to reduce the amount of contamination with iron from far above 500 ppm to distinctly less than 200 ppm.

In the following working examples, the invention is expounded even more clearly to those skilled in the art, but without being limited to the embodiments presented specifically.

EXAMPLE 1

A batch of the composition $Bi_{1.8}Pb_{0.4}Sr_2Ca_{2.2}Cu_3O_{10.3}$ was melted in a platinum crucible at a temperature of 1080° C. in air over a time of 1 h in a muffle furnace and cast into a Cu trough having a volume of 500 ml. The melt blocks thus obtained were coarsely crushed in a jaw crusher and in an analytical mill and then ground into a powder in an air-jet mill lined with tungsten carbide. The powder thus obtained is characterized as follows:

a. The composition according to ICP-AES analysis is: $Bi_{1.83}Pb_{0.40}Sr_{2.0}Ca_{2.09}Cu_3O_x$, with $x \leq 10.3$.
b. Contamination by crucible material and grinding medium: Fe=70 ppm; Pt=450 ppm
c. The mean grain size $d_{50}$ is 2.8 µm, determined by laser light diffraction.
d. X-ray powder diffraction patterns show, in addition to an amorphous fraction of 50%, a further 50% of crystalline phase which is composed as follows:
   60% of 1-layer compound,
   25% of alkaline earth metal cuprates,
   5% of alkaline earth metal plumbates, and
   10% of copper oxide.
e. Optical-microscope micrographs show an amorphous fraction of 50%.
f. SEM pictures show uniform, homogeneous grains.

EXAMPLE 2

$Bi_2O_3$, $Pb_{O2}$, $SrCO_3$, $CaCO_3$ and CuO were weighed in in a ratio $Bi_{1.7}Pb_{0.4}Sr_{1.9}Ca_{2.0}Cu_{3.1}O_{10+x}$, mixed and then heated to 750° C. under flowing nitrogen for 12 h, followed by renewed mixing and tempering under the same conditions for a further 40 h. The material thus obtained was melted in a Pt crucible at 1150° C. in air over a time of 30 min and then cast onto a Cu plate. The coarsely precrushed melt lumps were then heated for 12 h at 820° C. in a flowing gas atmosphere (100 l/h, $N_2:O_2$=80:20) and for a further 12 h at 780° C., likewise in a flowing gas atmosphere (100 l/h, $N_2:O_2$ =99.9:0.1). The material thus obtained is subjected to further coarse crushing and then ground in an air-jet mill lined with tungsten carbide.

The powder thus obtained is characterized as follows:
a) Contamination by crucible material and grinding medium
   Fe<50 ppm
   Pt=400 ppm
b) The mean grain size $d_{50}$ is 2.6 µm, determined by laser light diffraction
c) The following phase composition can be gauged from X-ray powder diffraction studies:
   80% of 2-layer compound
   15% of alkaline earth metal cuprates
   5% of CuO

We claim:
1. A process for preparing a high-temperature superconductor precursor containing bismuth, strontium, calcium and copper, wherein alkaline earth metal carbonates of strontium and calcium are broken down into their corresponding oxides, said oxides are then employed to form a mechanical mixture of the metal oxides containing the metals having a carbon content less than 5000 ppm and being in a stoichiometric ratio corresponding to a superconductor, wherein said mechanical mixture is first heated to temperatures in the range of from 600° to 900° C. for at least two hours in a flowing gas atmosphere and then completely melted in air at temperatures above 1000° C., said superconductor being selected from superconductors of the formula $Bi_2(Sr,Ca)_2CuO_6$, $Bi_2Sr_2CaCu_2O_8$ and $Bi_2Sr_2Ca_2Cu_3O_{10}$, wherein bismuth can be replaced, up to an amount of 50 mol %, by lead and/or antimony, wherein the melt is then poured out onto a base which is kept at room temperature to form a cooled melt body, said cooled melt body is broken up coarsely and then heated at a temperature from 600° to 900° C. to form a tempered melt body, and wherein the tempered melt body is coarsely crushed, disintegrated and then ground into powder having an Fe content of less than 200 ppm and an average grain size between 1 µm and 5 µm.

2. The process as claimed in claim 1, wherein the mixture, prior to melting, is filled into a crucible composed of platinum and then is melted in a furnace at temperatures above 1050° C.

3. The process as claimed in claim 1, wherein the duration of melting is more than 15 min.

4. The process as claimed in claim 3, wherein the duration of melting is more than 30 min.

5. The process as claimed in claim 1, wherein the melt is poured out onto a thermally stable plate.

6. The process as claimed in claim 5, wherein the thermally stable plate is composed of ceramic or metal.

7. The process as claimed in claim 6, wherein the thermally stable plate is composed of copper.

8. The process as claimed in claim 5, wherein the cooling rate of the melt is in the range of from 1 to 100 K/s.

9. The process as claimed in claim 8, wherein the cooling rate of the melt is in the range of from 5 to 30 K/s.

10. The process as claimed in claim 1, wherein the solidified melt body is broken up coarsely in a mortar or with a hammer and then is subjected to further coarse crushing and wherein the material is then further reduced in size until a grain size in the range of $d_{50} \leq 5$ µm is attained.

11. The process as claimed in claim 10, wherein the material is further reduced in size until a grain size in the range of $d_{50} \leq 3$ µm is attained.

12. A process as claimed in claim 1, wherein said carbon content is less than 1000 ppm.

13. A process of claim 1, wherein said powder is further treated by heating said powder to a temperature which is greater than 700° C. in the presence of oxygen.

14. A process of claim 1, wherein said mechanical mixture is formed by breaking down $SrCO_3$ and $CaCO_3$ into their corresponding oxides, SrO and CaO, and grinding said SrO and CaO with CuO, $Bi_2O_3$, and PbO or $PbO_2$.

15. A process of claim 14 wherein SrO and CaO are formed from $SrCO_3$ and $CaCO_3$ with a weight loss of less than 1%.

16. A process of claim 15, wherein said weight loss is less than 0.1%.

* * * * *